(12) United States Patent
Itani

(10) Patent No.: US 8,513,805 B2
(45) Date of Patent: Aug. 20, 2013

(54) MANUFACTURING OF A SEMICONDUCTOR DEVICE AND THE MANUFACTURING METHOD

(75) Inventor: Tsukasa Itani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 541 days.

(21) Appl. No.: 12/038,497

(22) Filed: Feb. 27, 2008

(65) Prior Publication Data

US 2008/0272491 A1 Nov. 6, 2008

(30) Foreign Application Priority Data

Feb. 27, 2007 (JP) ................................. 2007-046959

(51) Int. Cl.
*H01L 23/48* (2006.01)
(52) U.S. Cl.
USPC ........... 257/750; 257/751; 257/760; 257/762; 257/E23.161
(58) Field of Classification Search
USPC .................................. 257/750–775, E23.161
See application file for complete search history.

(56) References Cited

U.S. PATENT DOCUMENTS

| 2005/0006775 A1* | 1/2005 | Huang et al. ................... 257/758 |
| 2006/0009025 A1* | 1/2006 | Kanamura ..................... 438/618 |
| 2006/0192286 A1* | 8/2006 | Kanamura ..................... 257/758 |
| 2006/0246290 A1* | 11/2006 | Oda et al. ...................... 428/408 |

OTHER PUBLICATIONS

J. Robertson, "Ultrathin Carbon Coatings for Magnetic Storage Technology", Thin Solid Films 383 (2001) 81-88.
"Low-k Interlayer Dielectrics for 65 nm-Node LSIs", Magazine FUJITSU Jul. 2005 (vol. 56, No. 4).

* cited by examiner

*Primary Examiner* — H. Jey Tsai
(74) *Attorney, Agent, or Firm* — Westerman, Hattori, Daniels & Adrian, LLP

(57) ABSTRACT

A technology that improves the reliability of a semiconductor device and realizes a high performance by a laminated structure that has enough barrier properties against copper, reduces the wire delay time by lowering the capacitance between wirings and improves the adhesion between wirings is provided. There is a semiconductor device having: a first copper wiring layer, a first barrier layer on the first copper wiring layer, a silicon oxide series porous insulating layer on the first barrier layer, a second barrier layer on the silicon oxide series porous insulating layer, and a second copper wiring layer on the second barrier layer, wherein at least one of the first barrier layer and the second barrier layer consists of an amorphous carbon film, wherein a silicon series insulating layer is directly connected between the amorphous carbon film and any of the first copper wiring layer or the second copper wiring layer.

8 Claims, 6 Drawing Sheets

MANUFACTURING OF A SEMICONDUCTOR DEVICE AND THE MANUFACTURING METHOD

CROSS-REFERENCE TO RELATED APPLICATIONS

This application is based upon and claims the benefit of priority from the prior Japanese Patent Application No. 2007-46959 filed on Feb. 27, 2007, the entire contents of which are incorporated herein by reference.

FIELD OF THE INVENTION

The present invention relates to a semiconductor device having a low-dielectric constant (low-k).

BACKGROUND OF THE INVENTION

With the increase of integration level and the improvement of element density of semiconductor integrated circuits and semiconductor devices such as multilayer wiring devices, and as wire spacing becomes narrower, wiring delays due to increased capacitance between wiring lines becomes a problem.

The wire delay T is affected by wiring resistance and capacitance between wiring lines, and is a property represented by:

$$T \propto CR$$

with R being wiring resistance and C being capacitance between wiring lines.

In this formula, the capacitance C between wiring lines is represented by:

$$C = \epsilon S/D$$

with D representing a wire spacing, S, an electrode area (area of facing wire line surfaces), and $\epsilon$, a dielectric constant of an insulating material provided between the wiring lines.

As a result, lowering the dielectric constant of the insulating layer is an effective way to reduce the wire delay.

Conventionally, inorganic films of such as silicon dioxide (SiO2), silicon nitride (SiN) and phosphorus silicon glass (PSG) or organic polymers such as polyimide have been used as insulating materials.

However, the relative dielectric constant of a CVD-SiO2 film, which are used most commonly in semiconductor devices is about 4. In addition, even the relative dielectric constant of a SiOF film considered as a low dielectric constant film is about 3.3 to 3.5.

Under these circumstances, Nanoclustering Silica (NCS), which is a silica uniformly distributed holes with a size on a nanometer order, has been developed as a promising interlayer insulating material of low dielectric constant. The relative dielectric constant of this material is 2.25 which is drastically lower than that of conventional materials. Application of this material to an integrated circuit is considered.

However, it is known that in the case of a semiconductor device using copper wiring lines, if substances of silicon oxide series are used as interlayer insulating films, copper that is a substance of wiring diffuses in the insulating layer, deteriorates the electrical properties of the insulating layer and has a fatal impact on the device operation. As a result, a film whose one purpose is to prevent copper from diffusing is disposed between the interlayer insulating film and the wiring lines. This film may be called a diffusion prevention layer or a barrier layer.

Each of a conductive material and an insulating material can be used as a barrier layer. Which material to use is selected accordingly and arbitrarily depending on things such as which location to apply it to. When it is necessary to use an insulating material to form a barrier layer, the dielectric constant between wiring layers becomes higher by allocating this film because generally the dielectric constant of the material to form the barrier layer is higher than that of the material to form an interlayer insulating film.

As a result, when all the substances allocated between wiring lines are collectively considered, a semiconductor device that can reduce an effective "dielectric constant", that is to say, the semiconductor device that can reduce the capacitance between wiring lines and have few problems of delaminations or cracks between the wiring layer and the barrier layer, consequently, can reduce the capacitance between wiring lines and realize a high performance of the device, is demanded.

SUMMARY OF THE INVENTION

According to one aspect of an embodiment, there is a semiconductor device having: a first copper wiring layer, a first barrier layer on the first copper wiring layer, a silicon oxide series porous insulating layer on the first barrier layer, a second barrier layer on the silicon oxide series porous insulating layer, and a second copper wiring layer on the second barrier layer, wherein at least one of the first barrier layer and the second barrier layer consists of an amorphous carbon film, wherein a silicon series insulating layer is directly connected between the amorphous carbon film and any of the first copper wiring layer or the second copper wiring layer.

According to another aspect of an embodiment, there is a method for manufacturing a semiconductor device having: forming a first copper wiring layer, forming a first barrier layer on the first copper wiring layer, forming a silicon oxide series porous insulating layer on the first barrier layer, forming a second barrier layer on the silicon oxide series porous insulating layer, and forming a second copper wiring layer on the second barrier layer, wherein at least one of the first barrier layer and the second barrier layer consists of an amorphous carbon film, wherein a silicon series insulating layer is directly connected between the amorphous carbon film and any of the first copper wiring layer or the second copper wiring layer.

DETAILED DESCRIPTION OF THE DRAWINGS

Figure 1:
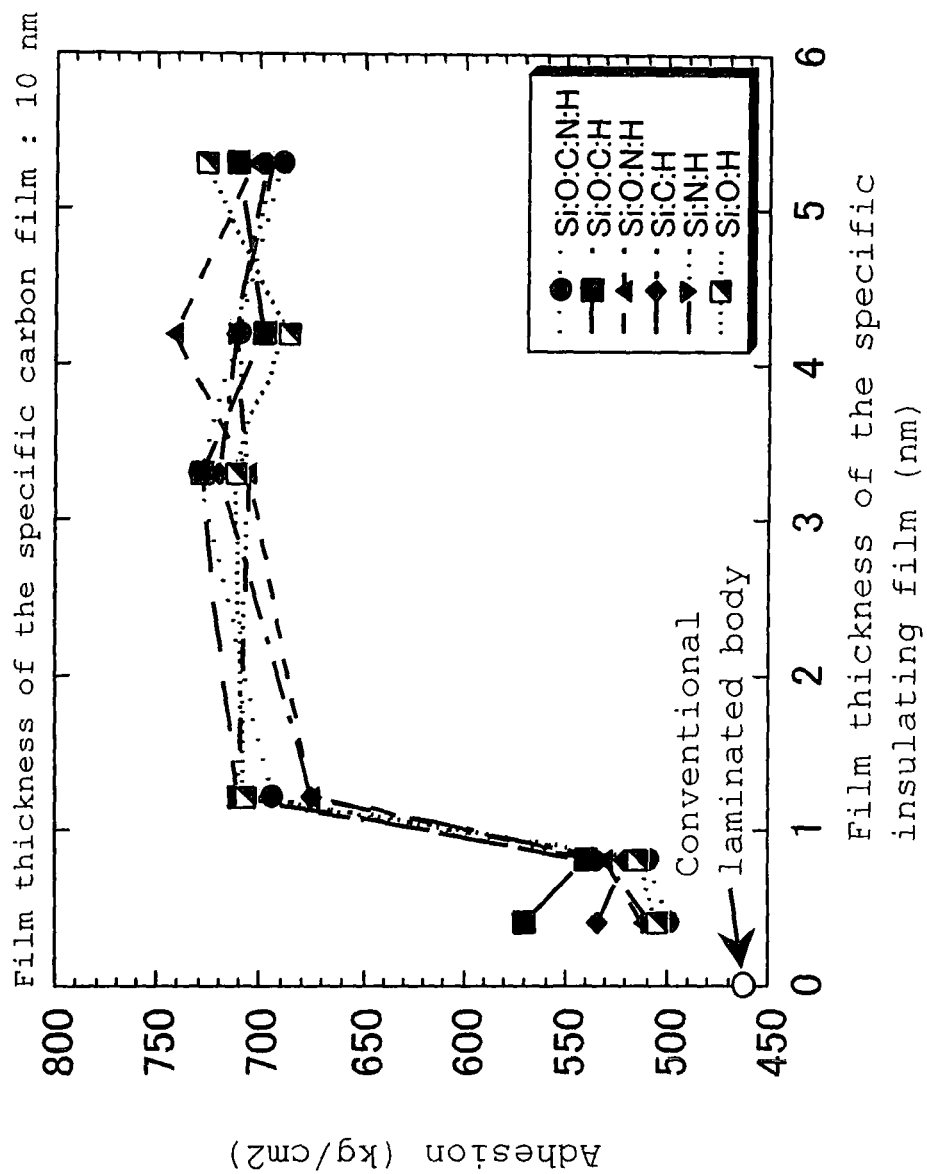
FIG. 1 is a graph showing the adhesion strength of several different compounds with a carbon film thickness of 10 nm.

Embodiments of the present invention will be explained below with reference to the diagrams and tables. In addition, these diagrams, tables and explanations will be provided as examples with respect to the present invention and they do not limit the scope of the present invention. Of course, other embodiments will be also within the scope of the present invention as long as they meet the spirit of the present invention.

For example, the semiconductor device is a semiconductor device including a copper wiring layer, and the semiconductor device has at least one laminated structure that comprises copper wiring layer, a barrier layer, a silicon series porous insulating layer (hereinafter called a "specific porous insulating layer" as well) directly connecting the barrier layer, a barrier layer directly connecting the specific porous insulating layer and copper wiring layer in this order, wherein at least one of the barrier layers is an amorphous carbon film (hereinafter called a "specific carbon film" as well) whose density is 2.4 g/cm$^3$ or more and there is a silicon series insulating film (hereinafter called a "specific insulating film" as well) directly connecting the specific carbon film and the copper wiring layers between the specific carbon film and the copper wiring layers. This structure gives a semiconductor device that has an insulating layer structure of low dielectric constant and excellent adhesion and barrier properties against Cu. As a result, a semiconductor device of high reliability and performance can be realized. In addition, "directly connecting" means there is no layer in-between.

The concrete laminated structures including,
1. a laminated structure including copper wiring layers, a first insulating layer directly connecting the copper wiring layers, a specific carbon film directly connecting the specific insulating layer, a specific porous insulating layer directly connecting the specific carbon film, a conductive or insulating barrier layer directly connecting the specific porous insulating layer, and copper wiring layers directly connecting the conductive or insulating barrier layer in this order;
2. a laminated structure including copper wiring layers, a conductive or insulating barrier layer directly connecting the copper wiring layers, a specific porous insulating layer directly connecting the conductive or insulating barrier layer, a specific carbon film directly connecting the specific porous insulating layer, a specific insulating layer directly connecting the specific carbon film and copper wiring layers directly connecting the specific insulating layer in this order; and
3. a laminated structure including copper wiring layers, a specific insulating layer directly connecting the copper wiring layers, a specific carbon film directly connecting the specific insulating layer, a specific porous insulating layer directly connecting the specific carbon film, a specific carbon film directly connecting the specific porous insulating layer, a specific insulating layer directly connecting the specific carbon film, and copper wiring layers directly connecting the specific insulating layer in this order.

Because the above structures enable a thinner layer than conventional barrier layers, enough barrier properties against copper can be maintained and a rise of dielectric constant can be curbed at the same time. Additionally, adhesion with copper can also be maintained by adding the first insulating layer.

The reason an insulating layer structure can have excellent adhesion with copper by using the specific insulating layer is not certain, though it is speculated that some bonding might occur between Si in the specific insulating layer, copper in the copper wiring layers, Si in the specific insulating layer and C in the specific carbon film by such a chemical reaction. Or stress-strain relaxation in the laminated structure might be related. However, these speculations have nothing to do with the spirit of the invention.

The reason for simply defining as "copper wiring layers" in the above-mentioned laminated structure is the laminated structure includes not only a case of being between two copper wiring layers but also a case of being between two copper wiring layers in one copper wiring layer. This means the laminated structure exists in the lamination direction of the semiconductor device and it can also exist in a direction perpendicular to the laminated structure. The term, the lamination direction of the semiconductor device, here means the direction in which many layers are laminated, for example, in the case of the multilayer wiring device.

This laminated structure can exist whether between the entire copper wiring layers or between partial copper wiring layers. Here "partial" means following cases when there are two or more combinations of copper wiring layers: a case in which the above mentioned laminated structure exists in some of the combinations of copper wiring layers, a case in which the above mentioned laminated structure exits in a part of interlayers of one combination of copper wiring layers, a case in which the above mentioned structure does not exist between copper wiring layers in one copper wiring layer though the above mentioned laminated structure exist between copper wiring layers, a case in which the above mentioned laminated structure does not exist between copper wiring layers though the above mentioned laminated structure exist between copper wiring layers in one copper wiring layer and other various cases.

As a method for manufacturing copper wiring layers is not limited, they can be manufactured using any well-known method. Both thickness and width are not particularly limited either.

Because the specific carbon film has excellent barrier properties against copper and a hard film structure, it may be sometimes called a hard carbon film. Any amorphous carbon film whose density is 2.4 g/cm$^3$ or more can be the specific carbon film, however a film made using a Filtered Cathodic Arc Method (FCA) is preferable.

As for the thickness, it is necessary to take prevention of copper migration from the copper wiring layers within a desired degree into account and 1 nm or more thickness is generally preferable. Thickness less than 1 nm may not have enough barrier properties against copper in many cases. As for the upper limit, 10 nm or less thickness is preferable. If the thickness becomes more than 10 nm, the effective capacity between copper wiring layers becomes higher and the merits of using the specific carbon film of the present invention become fewer.

For the details of the Filtered Cathodic Arc Method (FCA), it is described in J. Robertson, "Thin solid films," The solid films Vol. 383, p. 81 (2001). In a brief explanation, it can be manufactured as follows: such as solid graphite is used as a cathode and an arc discharge is generated in vacuum between the cathode and the opposing anode. Meanwhile, the graphite as a cathode discharges carbon ions and electrons as a plasma flow in vacuum. To remove neutral particles included in this plasma flow, the carbon films are accumulated on a substrate by bending the plasma flow using such as a magnetic field filter and by discharging it to the substrate installed ahead.

The dielectric constant of the specific carbon film varies depending on film forming conditions, however it will never be lower than that of a specific insulating porous layer if it is a film having enough barrier properties against copper at the current level of technology. However, even so, it turned out that the effective capacitance between the wiring layers can be lowered due to the above reason if an appropriate film thickness is selected. There is not a particular limit on the scope of the relative dielectric constant of the specific carbon film. Generally, it is possible to obtain carbon films whose relative dielectric constant is in the scope of 2.7 or more.

Except for the specific carbon film, the barrier layers can be selected from well-known substances accordingly. Representative substances for them are TiN, TaN, SiN, SiC, SiOC and SiON.

The specific insulating layers, that is to say, the silicon series insulating layers can be selected from the insulating layers including silicon accordingly. From a practical viewpoint, it is preferable to select any of an insulating film mainly made from silicon and oxygen (hereinafter abbreviated to SiO insulating film), an insulating film mainly made from silicon and carbon (hereinafter abbreviated SiC insulating film), an insulating film mainly made from silicon, oxygen and carbon (hereinafter abbreviated to SiOC insulating film), an insulating film mainly made from silicon and nitrogen (hereinafter abbreviated to SiN insulating film), an insulating film mainly made from silicon, oxygen and nitrogen (hereinafter abbreviated to SiON insulating film), and an insulating film mainly made from silicon, oxygen, carbon and nitrogen (hereinafter abbreviated to SiOCN insulating film). In any case, hydrogen can be included additionally. Here, "mainly made from" means each insulating film does not include elements other than the above symbols of elements and hydrogen for 10 percent or more atomic elements. Except for noble gases such as He, Ne and Ar, it is preferable not to include another element for 1 percent or more atomic element. It goes without saying that for example the SiC insulating film may include oxygen as another element other than the above symbols of elements and hydrogen. In addition, for practical use, another element can coexist as long as the insulating layers can maintain desired low dielectric constant and appropriate insulating. Any of these insulating layers can be selected from well-known ones accordingly.

The SiO insulating film can also be called a SiO2 series insulating film and one that is SiO2 or whose atomic composition ratio is close to SiO2 can be exemplified. There is not a particular limit on the method for manufacturing the SiO insulating film and it can be manufactured using a well-known method. For example, it can be manufactured by a CVD method using raw materials such as silane, organic silane compound, organic siloxane compound and oxygen.

There is not a particular limit on the method for manufacturing the SiC insulating film, either and a well-known method can be applied. For example, it can be manufactured by a CVD method using raw materials such as silane, organic silane compound and hydrocarbon such as methane and propane.

There is not a particular limit on the method for manufacturing the SiOC insulating film either, and a well-known method can be applied. Concretely, for example, by a CVD method using raw materials of only organic siloxane compound such as tetraethoxysilane (TEOS) or of organic siloxane compound and carbon monoxide, or by a method using such as silicon-containing materials including silicon and carbon in the host framework or the main chain, or additionally including oxygen also in the host framework or the main chain as raw materials and performing cross-linking film formation by such as heating can be enumerated. To put it more concretely, for example, by a method using such as polycarbosilane, polycarboxysilane including oxygen in the main chain and silanol, and performing cross-linking film formation by such as heating can be enumerated.

There is not a particular limit on the method for manufacturing the SiN insulating film, either and a well-known method can be applied. For example, it can be manufactured by a CVD method using raw materials such as silane and ammonia.

There is not a particular limit on the method for manufacturing the SiON insulating film, either and a well-known method can be applied. Concretely, for example, by a method using materials of introducing N from such as amino groups to the substances used for the above SiOC insulating film, and performing cross-linking film formation by such as heating can be enumerated. In addition, it can be manufactured by a CVD method using raw materials of organic siloxane compound such as tetraethoxysilane (TEOS) and ammonia, or of carbon dioxide.

There is not a particular limit on the method for manufacturing the SiOCN insulating film, either and a well-known method can be applied. For example, it can be manufactured by a CVD method using raw materials such as organic siloxane compound such as silane or tetraethoxysilane (TEOS), nitrogen compound such as ammonia or nitrogen dioxide, and carbon compound such as carbon monoxide.

To the specific porous insulating layer, that is to say, the silicon oxide series porous insulating layer, compositions the same as or the similar to those of the above specific insulating layers can be applied except for the points that it is porous and silicon and oxygen are essential elements for it.

Porousness is useful to lower a relative dielectric constant. There is not a particular limit on the porous size, though too large size is not preferable since the mechanical property deteriorates in many cases. Generally, the average porous diameter is preferably several nm to 10 nm. There is not a particular limit on the number of porousness, either, though too much porousness deteriorates the mechanical property and too little porousness makes it difficult to lower the relative dielectric constant. As a result, it is practical to select a manufacturing condition accordingly depending on the use application. The specific insulating layer can be a porous one, though one without porousness is generally preferable because the existence of porousness lowers the adhesion with copper wiring layers.

Whether to use an insulating layer with porousness or an insulating layer without porousness can be determined by the manufacturing condition of the insulating layer in many cases. For example, the selection of appropriate raw materials can be determined by a CVD method. For example, when organic siloxane compound as a raw material is used, a porous structure can be made by forming films using a raw material having a functional group that has a huge excluded volume in a part of the side chain, or after forming the films of insulating layer, by performing heat treatment using a raw material having a functional group that is easily withdrawn by heat in a part of the side chain. There is not a particular limit on the method for manufacturing the specific porous insulating films, and a well-known method can be applied.

As the specific porous insulating layer, it is preferable to use Nanoclustering Silica (NCS) that is silica particles where nanometer-order holes are equally distributed. Nanoclustering Silica (NCS) can be obtained from Catalysts & Chemicals Industries Co., Ltd. as serial number: Ceramate NCS. Because Nanoclustering Silica (NCS) can be obtained in the form of liquid solution, it is possible to make Nanoclustering Silica (NCS) in the form of film, for example, by coating it with a spin coat method and applying heat treatment to it. The details about Nanoclustering Silica (NCS) are described in Fujitsu magazine Vol. 56, No. 4.

In addition, layer formation of the specific insulating layers and the specific porous insulating layers is possible by using a well-known method such as vapor deposition, spray and coating. It is especially preferable that the specific insulating layer is formed by a CVD method because coatability by a film of nm-order thickness on the surface of the base material is important. Further, it is preferable that the specific porous insulating layer is coated by such as a spin coat.

There is not a particular limit on the thickness of the specific insulating layer, the thickness can be decided based on the practical requests regarding such as insulating, dielectric constant, adhesion with copper and barrier properties against copper, though generally, it is preferable that the thickness of the specific insulating layer is in the range of 1 to 8 nm due to the balance between dielectric constant and adhesion with copper. In view of the combination with the specific carbon film, to realize the barrier properties against copper, the low dielectric constant properties and adhesion with upper at the same time, it is preferable that the thickness of the specific insulating layer is in the range of 1 to 8 nm and the thickness of the specific carbon film is in the range of 1 to 1 nm.

There is not a particular limit on the relative dielectric constant of the specific insulating layer and the specific porous insulating layer. Though the lower the relative dielectric constant becomes the more preferable it becomes, other properties might deteriorate. As a result, it is necessary to decide the relative dielectric constant based on the practical request accordingly. It is generally preferable that the relative dielectric constant of the specific porous layer is 2.4 or less. Compared to this, the dielectric constant of the specific insulating layer is higher in many cases, because usually the specific insulating layer is not porous.

Though the present invention can be applied to an arbitrary semiconductor device, it is preferable that a semiconductor device comprises a multilayer wiring structure and at least a part of the multilayer structure includes this laminated structure. Especially, because a semiconductor device that comprises highly integrated multilayer structure has many needs for low dielectric constant, it is especially useful to use the present invention for such use. No matter what name the combination part between the specific insulating layer, the specific carbon film and the specific porous insulation layer is called, it is within the scope of the present invention as long as the above-mentioned conditions are met. As the most general names, it may be called such as a diffusion prevention layer, a diffusion prevention film, a cap layer, an etch stop layer, an interlayer insulation film, an interlayer insulation layer, an ILD layer and an wiring insulating layer.

The semiconductor device can be manufactured by including the operation to laminate the copper wiring layers, the specific insulating layer, the specific carbon film and the specific porous insulating layer in this order or in the reverse order to the manufacturing process.

In that case, it is preferable to include heat treatment as stated above after forming the copper wiring layers, the silicon series insulating layer directly connecting the copper wiring layers, and the specific carbon film directly connecting the silicon series insulating layer because it enables to obtain an insulating layer structure having excellent adhesion with copper.

This heat treatment can be performed anytime whenever the above conditions are satisfied, though if the specific porous insulating layer is formed by a coating method, heat treatment to perform hardening reaction becomes necessary as well. As a result, if the formation of the specific porous insulating layer is performed after the above conditions are met, it is preferable and rational in many cases not to perform heat treatment or to perform heat treatment only to some extent immediately after the above conditions are met, and to perform heat treatment after forming the specific porous insulating layer. When the specific insulating layer is performed by a coating method as well, similarly, this heating can be used for hardening it. Concretely, this corresponds to the case when the copper wiring layers, the silicon series insulating layer directly connecting the copper wiring layers, the barrier layer directly connecting the silicon series insulating layer, and the silicon oxide series porous insulating layer directly connecting the barrier layer are formed in this order.

On the contrary, if the formation of the specific porous insulating layer is performed before the above conditions are met, it is rational and preferable in many cases not to perform heat treatment or to perform heat treatment only to some extent immediately after the specific porous insulating layer is formed, and perform heat treatment after the above conditions are met. Concretely, this corresponds to the case when the silicon oxide series porous insulating layer, the barrier layer directly connecting the silicon oxide series porous insulating layer, the silicon series insulating layer directly connecting the barrier layer, and the copper wiring layers directly connecting the silicon series insulating layer are formed in this order.

When the above two cases are performed in a row, it may be rational and preferable not to perform heat treatment or to perform heat treatment only to some extent in the first case, and after that perform heat treatment in the second case.

It was found that 240° C. or higher is preferable for the heating temperature. As the upper limit temperature for heating can be thought as the temperature at which the specific insulating layer and the specific porous insulating layer are not decomposed or are hardly decomposed. As a result, the upper limit depends on the material to use. Generally, it is appropriate to perform treatment at 500° C. or less. There is not a particular limit on the heat treatment time, and one minute or more is enough in many cases.

Next, embodiments of the present invention will be explained in detail.

[Embodiment1]

Figure 3:
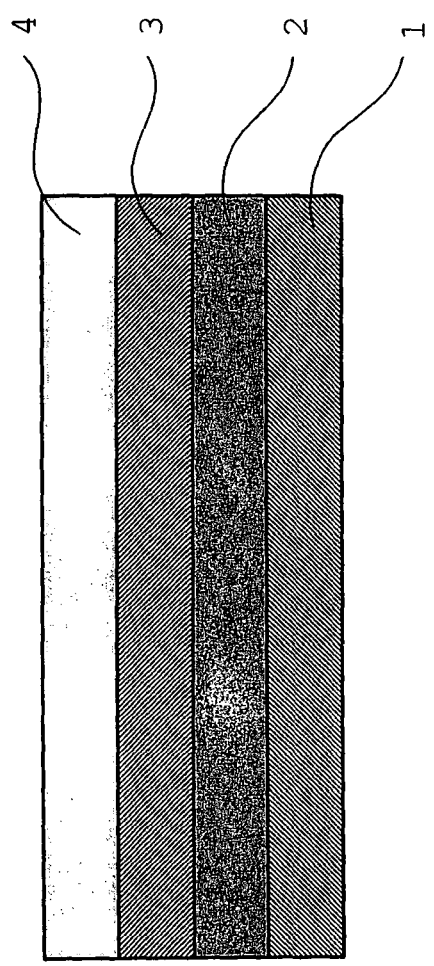
FIG. 3 is a sideview of a semiconductor structure of one embodiment of the invention.

A 40-nm copper film was formed on a thermally-oxidized Si wafer 1 by a sputtering method, and various specific insulating layers (SiO insulating film, SiC insulating film, SiOC insulating film, SiN insulating film, SiON insulating film and SiOCN insulating film, however hydrogen coexists with all of them) were formed by a plasma CVD device. The thickness of the specific insulating layers was adjusted by changing film formation time. In addition, Si:O:C:H means a SiOC insulating film where hydrogen coexists, Si:O:N:H means a SiON insulating film where hydrogen coexists, Si:C:H means a SiC insulating film where hydrogen coexists, Si:O:H means a SiO insulating film where hydrogen coexists, Si:N:H means a SiN insulating film where hydrogen coexists, and Si:O:C:N:H means a SiOCN insulating film where hydrogen coexists in this specification. After that, a specific carbon film whose density is 2.8 g/cm$^3$ and thickness is 10 nm, was formed by a FCA method (using NTI-made device) and a laminated body of a copper film 2, a specific insulating layer 3 and a specific carbon film 4 as shown in FIG. 3. The film formation conditions of these films are shown in Table 1. After that, a sample was prepared by heating the laminated body for two minutes at 400° C. in a vacuum.

TABLE 1

| Film Composition | Film Formation Method | Raw Materials | Film Formation Temperature (° C.) | Output (W) |
|---|---|---|---|---|
| Si:O:C:H | CVD | TEOS + $N_2$ | 300 | 75 |
| Si:O:N:H | CVD | $NO_2$ + $SiH_4$ + $N_2$ | 300 | 75 |
| Si:C:H | CVD | $SiH_4$ + $C_3H_8$ | 300 | 75 |
| Si:O:H | CVD | TEOS + $O_2$ | 300 | 75 |
| Si:N:H | CVD | $SiH_4$ + $NH_3$ | 300 | 75 |
| Si:O:C:N:H | CVD | TEOS + $NH_3$ + CO | 300 | 75 |
| Cu | Sputtering | Cu target | 200 | 750 |
| Specific Carbon Film | FCA | C target | Room Temperature | 120 V, 60 A |

The adhesion of these laminated bodies was evaluated by using a pull tester (a Sebastian Five stud-pull tester manufactured by Quad group). As for a test sample, a metal pin was epoxied on the surface of the laminated body (on the specific carbon film) with epoxy adhesive (product name: Araldite) and the adhesion was evaluated by pulling the metal pin.

FIG. 1 shows the relation between the adhesion of the laminated body and the film thickness of the specific insulating layer. When the specific insulating layer was thinner than 1 nm, delamination occurred as the copper film and the specific carbon film were separated, though the adhesion was remarkably improved by making the thickness of the specific insulating layer 1 nm or thicker. With this approach, it is understood that the adhesion is improved by inserting the specific insulation layer.

[Embodiment2]

A laminated body having the same structure as that of Embodiment 1 was made as the thickness of the insulating layer was 1.5 nm and the thickness of the specific carbon film was 9 nm. The film formation condition was similar to the above. After that, a sample was prepared by performing heat treatment to the laminated body for 2 minutes in a vacuum at different temperature.

Figure 2:
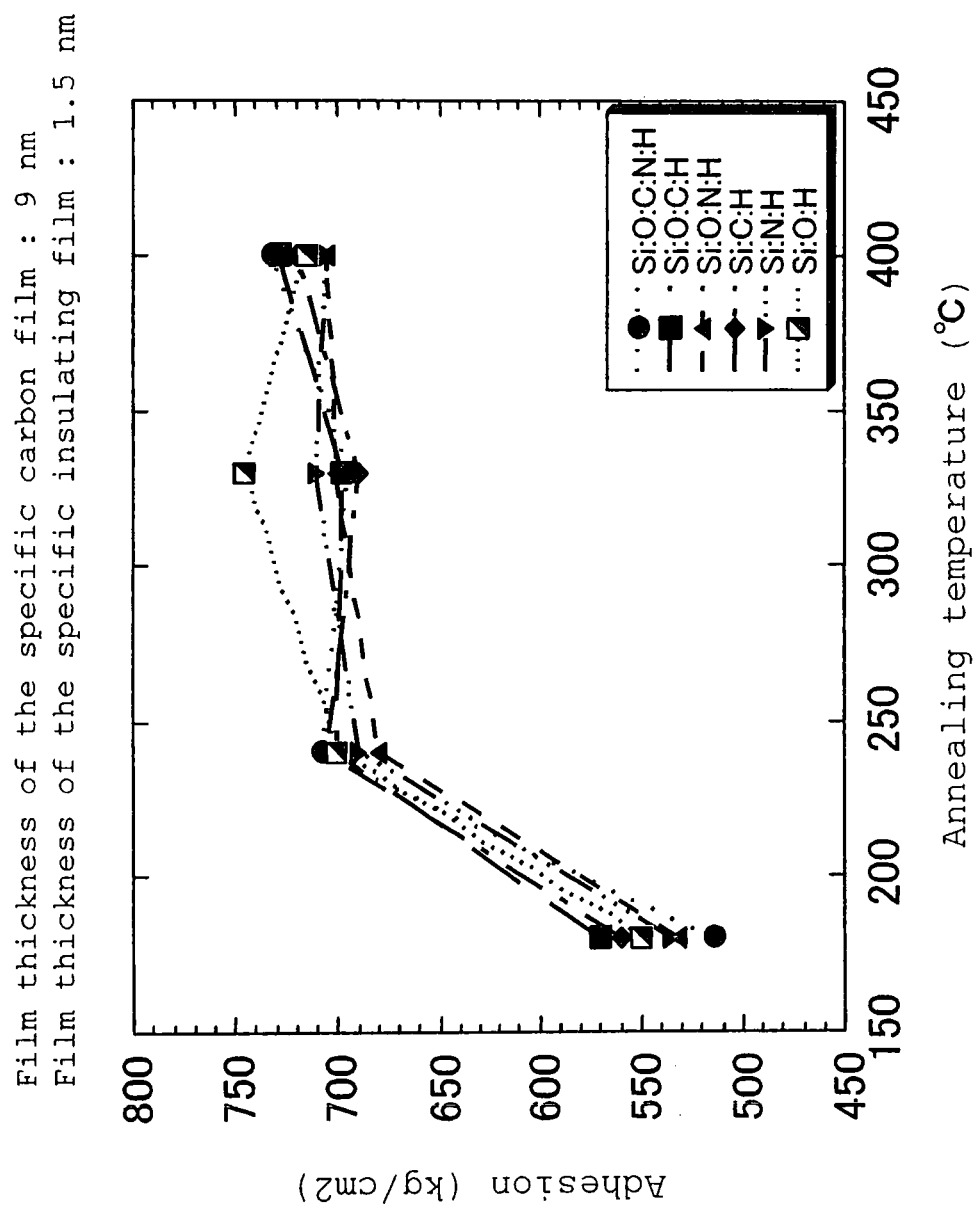
FIG. 2 is a graph showing the adhesion strength of several different compounds with a carbon film thickness of 9 nm and an insulating film thickness of 1.5 nm.

The similar pull test as discussed above was performed to these laminated bodies and the result is shown in FIG. 2. It turned out that the adhesion was remarkably improved by 240° C. or higher temperature of heat treatment.

[Embodiment3]

Figure 4:
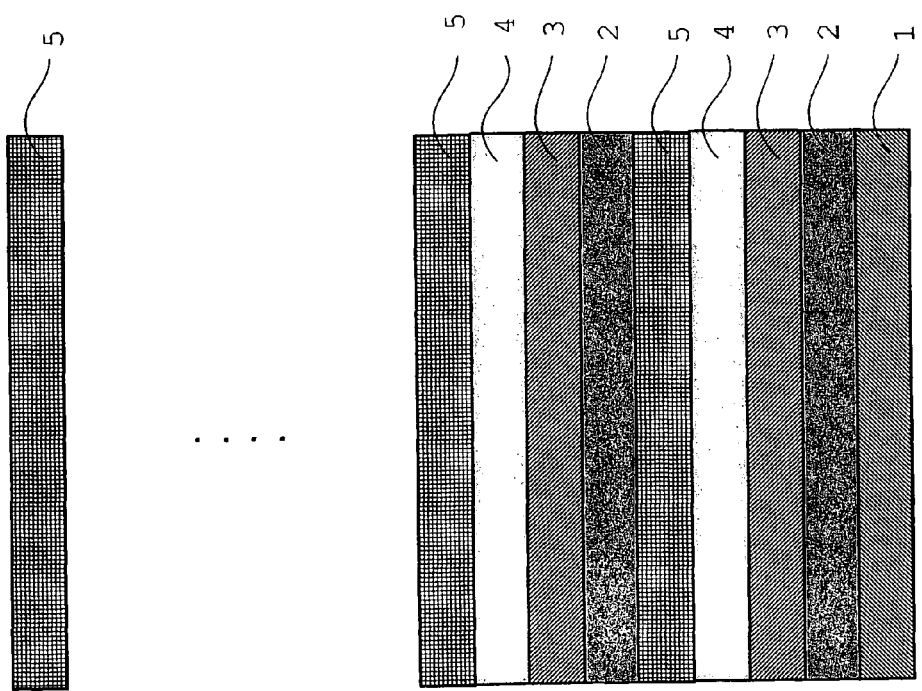
FIG. 4 is a sideview of a semiconductor structure of one embodiment of the invention.

To see the effect of inserting the specific insulating layer on a multilayer laminated body, a laminated body as shown in FIG. 4 was made. At this time, the total number of repeating unit of the multilayer laminated body is six.

Laminated methods performed to each layer was as follows: That is to say, 100 nm copper film 2 was formed on the thermally-oxidized Si wafer 1 by a sputtering method, then various specific insulating layers 3 (Si:O:C:H, Si:O:N:H, Si:C:H, Si:O:H, Si:N:H, Si:O:C:N:H of 1.5 nm thickness each) were formed on the copper film by a sputtering method or by a parallel plate plasma CVD apparatus under the same condition as that of Embodiment 1. To compare, a multilayer laminated body was made without these specific insulating layers 3.

Next, a specific carbon film 4 whose density was 2.6 g/cm$^3$ and thickness was 10 nm, was formed by a FCA method (using NTI-made device). Further, a specific porous insulation layer 5 formed as below was used. That is to say, the film formation was performed by coating Catalysts & Chemicals Industries Co., Ltd.—made Nanoclustering Silica (serial number: Ceramate NCS) by a spin coat method (Coating condition: rotational speed 3000 rpm and for 30 seconds). The laminated body including the copper film 2, the specific insulating layer 3, the specific carbon film 4 and the specific porous insulating layer 5 was heated at 300° C. for 3 minutes in N2 gas.

After that, the copper film 2, the specific insulating layer 3, the specific carbon film 4 and the specific porous insulating layer 5 were formed and heated. This process was repeated the number of desired number. In addition, because the purpose of this embodiment was to evaluate the adhesion, a structure having not a barrier film between the specific porous insulating layer 5 and the copper film 2 was also included.

After making a laminated body in this manner, the laminated body was heated at 400° C. for 2 minutes in N2 and cooled until it became the room temperature. This heating-cooling cycle was repeated 20 cycles and it was examined whether the films were delaminated or not. Whether the films were delaminated or not was evaluated by the same pull tester as Embodiment 1 and those who had adhesion of 300 kg/cm2 or less were determined as "delaminated."

Figure 5:
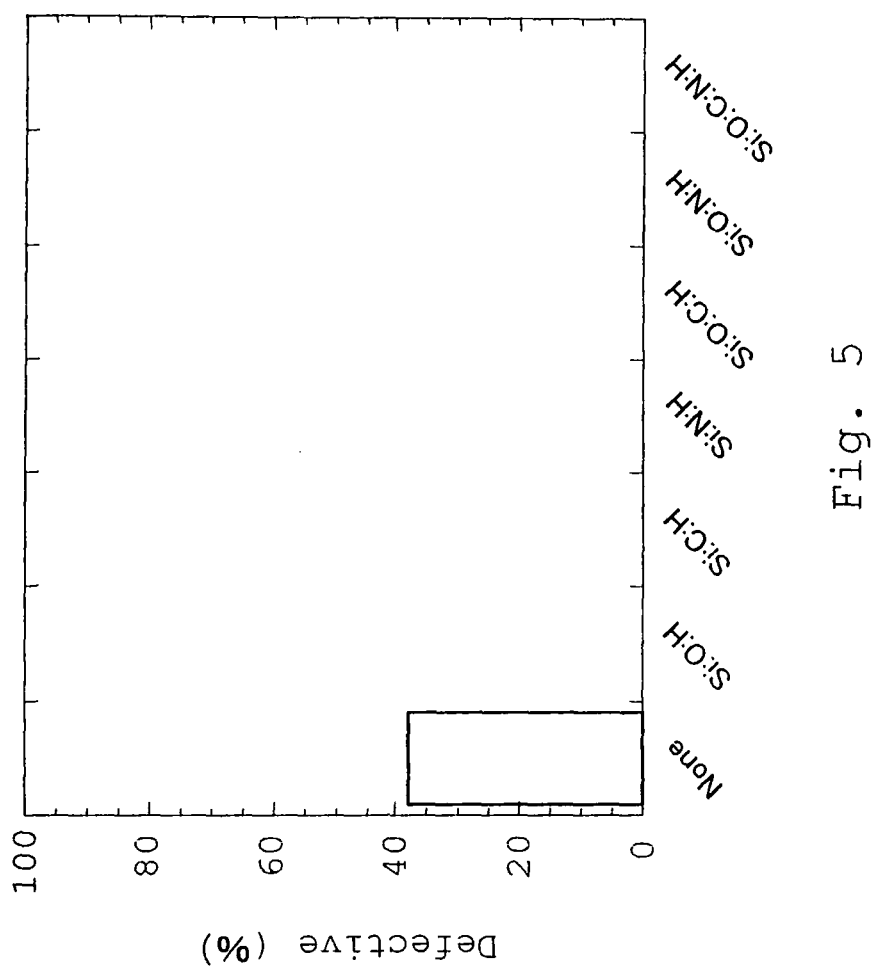
FIG. 5 is a chart showing the defective rate of several different compounds.

The percent defective by calculating the films determined as delaminated as defective is shown in FIG. 5. The percent defective of the laminated body made without using the specific insulating layer was 38% and that of the laminated body using the specific insulating layer was 0%.

[Embodiment4]

Figure 6:
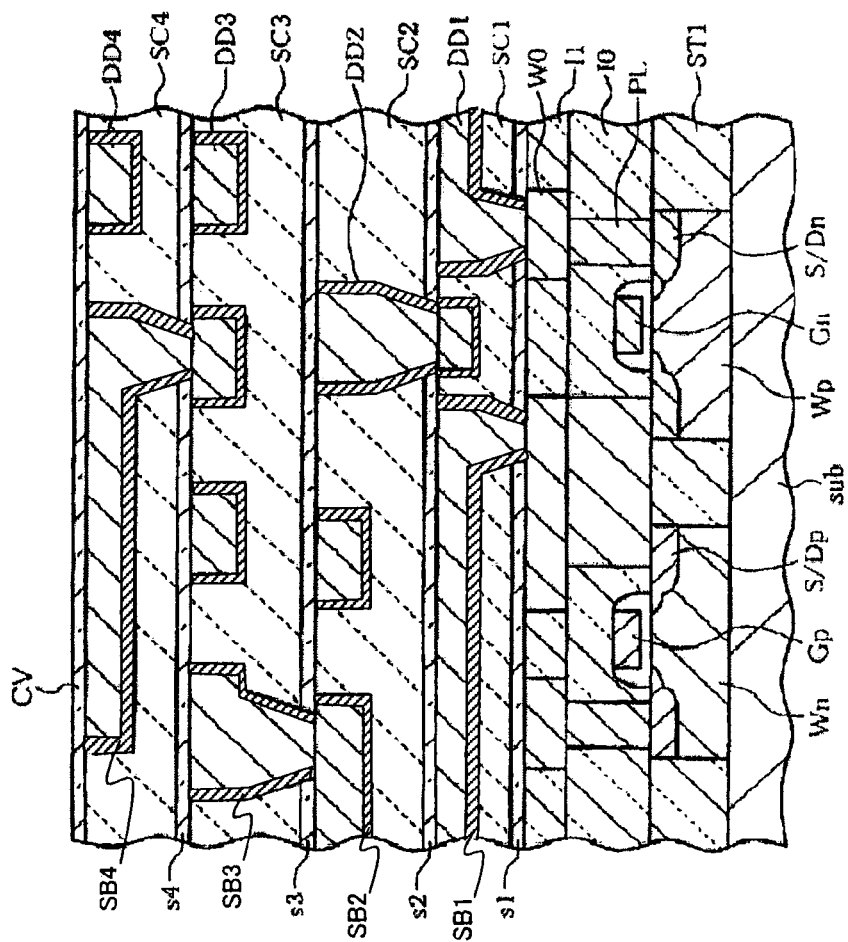
FIG. 6 is a sideview of a semiconductor structure of one embodiment of the invention.

FIG. 6 roughly shows a section of a semiconductor integrated circuit made by using "a laminated structure including copper wiring layers, a silicon series insulating layer directly connecting the copper wiring layers, a barrier layer directly connecting the silicon series insulating layer, a silicon oxide series porous insulating layer directly connecting the barrier layer, a barrier layer directly connecting the silicon oxide series porous insulating layer, and copper wiring layers directly connecting the barrier layer in this order."

An N-type well Wn and a P-type well Wp were formed on the surface of a silicon substrate sub. An element isolation area STI by Shallow Trench Isolation was formed so as to surround the active region. A P-type gate electrode Gp was formed on the N-type well Wn, and P-type source/drain areas S/Dp were formed on the both sides of it by the LDD structure. An N-type well Wn and a P-type well Wp were formed on the surface of a silicon substrate sub. An element isolation area STI by Shallow Trench Isolation was formed so as to surround the active region. P-type gate electrode Gp was formed on the N-type well Wn, and P-type source/drain areas S/Dp were formed on the both sides of it by the LDD structure. Similarly, a N-type gate electrode Gn was formed on the upper side of the P-type Wp and N-type source/drain areas S/Dn were formed on the both sides of it.

A first underlayer insulation layer was formed on the surface of the silicon substrate and a contact hole was formed. A plug electrode PL such as W was filled in the contact hole. A second underlayer insulation layer 11 was formed on the first underlayer insulating layer 10, in which an underlayer wirings W0 were filled. In addition, the underlayer insulating layers I0 and I1 were formed by oxidized silicon and the underlayer wirings W0 were formed by copper.

Covering the underlayer wirings W0 and the insulating layer I1, an etching stopper layer S1, a low dielectric constant insulating layer SC1, an etching stopper layer S2, a low dielectric constant insulating layer SC2, an etching stopper layer S3, a low dielectric constant insulating layer SC3, an etching stopper layer S4 and a dielectric insulating layer SC4 were laminated.

In these four interlayer insulating layers, copper dual damascene wirings DD1, DD2, DD3 and DD4 were formed from the lower layer to the upper layer adjacent to metal barrier layers SB1 to SB4 made of TiN of 9 nm-thickness respectively. On the top layer, a cover layer CV was formed. A cover layer CV can be formed by for example a SiN film.

The etching stopper layers S1 to S4 comprised a laminated body of the specific insulating layer and the specific carbon film of the present invention. For the specific insulation layer, "Si:O:C:H" was used and the thickness was made 1 nm. In addition, the thickness of the specific carbon film was made 3 nm. The specific carbon film was an amorphous carbon film of 3.1 g/cm$^3$ density.

Low dielectric constant insulating layers SC1 to SC4 comprised Nanoclustering Silica (NCS) corresponding to silicon oxide series porous insulating layers of the present invention and including many holes whose diameter was about 3 nm, and the thickness of each layer was about 182 nm.

Above-mentioned structure made it possible to insulate wiring layers in the insulating layers having remarkably low relative dielectric constant. In addition, a well-known technology can use for the structure of wiring layers.

As comparison to this, an integrated circuit was made in the etching stopper layer by using Si:O:C:H of 45 nm-thickness.

As a result of comparing wire delay times of above-mentioned two or more integrated circuits, the wire delay time of the integrated circuit having the structure of Embodiment 4 was 18% shorter than that of the circuit having the structure for comparison.

[Embodiment5]

This embodiment is about a semiconductor integrated circuit made by using "a laminated structure including copper wiring layers, a silicon series insulating layer directly connecting the copper wiring layers, a barrier layer directly connecting the silicon series insulating layer, a silicon oxide series porous insulation layer directly connecting the barrier layer, a barrier layer directly connecting the silicon oxide series porous insulation layer, a silicon series insulation layer directly connecting the barrier layer, and copper wiring layers directly connecting the silicon series insulation layer in this order."

As for metal barrier layers SB1 to SB4, a semiconductor integrated circuit was made in a similarly way to Embodiment 4 except for using the layer of the same construction as the etching stopper layer used in Embodiment 4.

As a result of comparing the wire delay time of this integrated circuit with the wire delay time of the integrated circuit for comparison used in Embodiment 4, the wire delay time of the structure of this embodiment was 19% shorter than that of the structure for comparison.

What is claimed is:

1. A semiconductor device comprising:
a laminated structure including:
a first copper wiring layer,
a first barrier layer on the first copper wiring layer,
a silicon oxide series porous insulating layer on the first barrier layer,
a second barrier layer on the silicon oxide series porous insulating layer and,
a second copper wiring layer on the second barrier layer,
wherein at least one of the first barrier layer and the second barrier layer consists of an amorphous carbon film and a silicon series insulating layer
wherein at least one of the silicon series insulating layer of the first barrier layer and the silicon series insulating layer of the second barrier layer is formed such that the silicon series insulating layer of the first barrier layer is in direct contact with the amorphous carbon film of the first barrier layer and the first copper wiring layer or the silicon series insulating layer of the second barrier layer is in direct contact with the amorphous carbon film of the second barrier layer and the second copper wiring layer,
at least one of the silicon series insulating layer of the first barrier layer and the silicon series insulating layer of the second barrier layer includes Hydrogen and any of SiO, SiC, SiOC, SiN, SiON and SiOCN,
and at least one of the first barrier layer and the second barrier layer is formed such that the first barrier layer is consistently formed of both the amorphous carbon film of the first barrier layer and the silicon series insulating layer of the first barrier layer that is between an entirety of the first copper wiring layer and the silicon oxide series porous insulating layer and the second barrier layer is consistently formed of both the amorphous carbon film of the second barrier layer and the silicon series insulating layer of the second barrier layer that is between an entirety of the second copper wiring layer and the silicon oxide series porous insulating layer.

2. The semiconductor device of claim 1, wherein:
at least one of the amorphous carbon film of the first barrier layer and the amorphous carbon film of the second barrier layer has 2.4 g/cm$^3$ or more density.

3. The semiconductor device of claim 1, wherein:
at least one of the thickness range of the silicon series insulating layer of the first barrier layer and the thickness range of the silicon series insulating layer of the second barrier layer is 1 to 8 nm and at least one of the thickness range of the amorphous carbon film of the first barrier layer and the amorphous carbon film of the second barrier layer is 1 to 10 nm.

4. The semiconductor device of claim 1, wherein:
the laminated structure exists at least either in the lamination direction of the semiconductor device or in the direction perpendicular to the lamination.

5. The semiconductor device of claim 1, wherein:
the silicon oxide series porous insulating layer has the relative dielectric constant of 2.4 or less.

6. The semiconductor device of claim 1, wherein:
the semiconductor device comprises a multilayer wiring line structure and at least a part of the multilayer wiring line structure includes the laminated structure.

7. The semiconductor device of claim 1, wherein:
the first barrier layer and the second barrier layer have 2.4 g/cm$^3$ or more density.

8. The semiconductor device of claim 1, wherein:
the first barrier layer or the second barrier layer are an amorphous carbon film of 2.4 g/cm$^3$ or more density.

* * * * *